(12) United States Patent
Nouri

(10) Patent No.: US 10,910,418 B2
(45) Date of Patent: Feb. 2, 2021

(54) READOUT SYSTEMS AND METHODS BASED ON A COINCIDENCE THRESHOLD

(71) Applicant: Babak Nouri, Berwyn Heights, MD (US)

(72) Inventor: Babak Nouri, Berwyn Heights, MD (US)

(73) Assignee: KISKEYA MICROSYSTEMS LLC, Rockville, MD (US)

( * ) Notice: Subject to any disclaimer, the term of this patent is extended or adjusted under 35 U.S.C. 154(b) by 0 days.

(21) Appl. No.: 16/273,125

(22) Filed: Feb. 11, 2019

(65) Prior Publication Data

US 2019/0259792 A1   Aug. 22, 2019

Related U.S. Application Data

(60) Continuation of application No. 15/588,576, filed on May 5, 2017, now Pat. No. 10,204,944, which is a division of application No. 14/735,105, filed on Jun. 9, 2015, now Pat. No. 9,702,758.

(60) Provisional application No. 62/009,887, filed on Jun. 9, 2014.

(51) Int. Cl.
| | | |
|---|---|---|
| *H01L 27/14* | (2006.01) | |
| *H01L 27/146* | (2006.01) | |
| *H01L 31/02* | (2006.01) | |
| *G01J 1/46* | (2006.01) | |
| *G01J 1/42* | (2006.01) | |
| *G01T 1/17* | (2006.01) | |
| *G01J 1/44* | (2006.01) | |

(52) U.S. Cl.
CPC ...... *H01L 27/14609* (2013.01); *G01J 1/4228* (2013.01); *G01J 1/46* (2013.01); *G01T 1/17* (2013.01); *H01L 27/14643* (2013.01); *H01L 31/02016* (2013.01); *G01J 2001/4473* (2013.01)

(58) Field of Classification Search
CPC .... G01J 1/4228; G01J 1/44; G01J 1/46; G01J 2001/442; G01J 2001/4466; G01T 1/17
See application file for complete search history.

(56) References Cited

U.S. PATENT DOCUMENTS

| | | |
|---|---|---|
| 9,671,284 B1 | 6/2017 | Dandin |
| 10,594,306 B2 | 3/2020 | Dandin |
| 2014/0175294 A1* | 6/2014 | Frach ............... H04N 5/369 250/363.03 |

OTHER PUBLICATIONS

M. Dandin et al., "Characterization of Single-Photon Avalanche Diodes in a 0.5 μm Standard CMOS Process—Part 1: Perimeter Breakdown Suppression," IEEE Sensors Journal., vol. 10, No. 11, pp. 1682-1690, Nov. 2010.
M. Dandin et al., "High Signal-to-Noise Ratio Avalanche Diodes with Perimeter Field Gate and Active Readout," IEEE Electron Device Letters, vol. 33, No. 4, pp. 570-572, Apr. 2012.
A. Akturk et al. "Silicon Carbide Ultraviolet Photodetector Modeling, Design and Experiments," Materials Science Forum, vols. 717-720, pp. 1199-1202, May 2012.

(Continued)

*Primary Examiner* — Tony Ko

(57) ABSTRACT

Methods and systems for reading out a pixel array are provided. An example system may be configured to represent the activity of at least two pixels in the array as at least two digital signals. Further, the example system may be configured to dynamically aggregate the at least two digital signals into one representative analog signal corresponding to the activity of the at least two pixels.

17 Claims, 11 Drawing Sheets

(56) References Cited

OTHER PUBLICATIONS

M. Dandin et al., "Optoelectronic Characterization of 4H-SiC Avalanche Photodiodes Operated in DC and in Geiger Mode," in proceedings of IEEE International Semiconductor Device Research Symposium (ISDRS), College Park, Maryland, USA, pp. 1-2, Dec. 2011.

B. Nouri et al., "Characterization of Single-photon Avalanche Diodes in Standard CMOS," in IEEE Sensors Conference, Christchurch, New Zealand, pp. 1889-1892, Oct. 2009.

N. Nelson et al., "A Handheld Fluorometer for Measuring Cellular Metabolism," in IEEE International Symposium on Circuits and Systems, Seattle, Washington, USA, pp. 1080-1083, May 2008.

M. Dandin et al., "Single-Photon Avalanche Detectors in Standard CMOS," in IEEE Sensors Atlanta, Georgia, USA, pp. 585-588, Oct. 2007.

N. Nelson et al., "A Hand-held Fluorometer for UV-Excitable Fluorescence Assays," in IEEE Biomedical Circuits and Systems Conference, Montréal, Québec, Canada, pp. 111-114, Dec. 2007.

N. Nelson et al., "Hand-held Fluorometers for Lab-on-a-Chip Applications," IEEE Trans. Biomed. Circuits Syst., vol. 3, pp. 97-107, Apr. 2009.

M. Dandin et al., "Characterization of Single-Photon Avalanche Diodes in a 0.5 µm Standard CMOS Process—Part 2: Equivalent Circuit Model and Geiger Mode Readout," IEEE Sensors Journal., vol. 16, No. 9, pp. 3075-3083, May 2016.

B. Nouri, M. Dandin, and P. Abshire, "Large-area low-noise single-photon avalanche diodes in standard CMOS," in 2012 IEEE Sensors, Taipei, Taiwan, pp. 1-5, Oct. 2012.

P. Abshire et al., "Confession session: learning from others' mistakes," in 2011 IEEE International Symposium of Circuits and Systems (ISCAS), pp. 1149-1162, May 2011.

A. Akturk, M. Dandin, N. Goldsman, and P. Abshire, "Modeling of perimeter-gated silicon avalanche diodes fabricated in a standard single-well CMOS process," in 2009 International Semiconductor Device Research Symposium, Dec. 2009, pp. 1-2.

M. Dandin and P. Abshire, "Near breakdown spectral responsivity of perimeter-gated single-photon avalanche diodes," in 2017 IEEE 60th International Midwest Symposium on Circuits and Systems (MWSCAS), Oct. 2017, pp. 867-870.

I. Weinberg, P. Y. Stepanov, A. S. Weinberg, P. Abshire, and M. Dandin, "Improvement of energy resolution in Geiger-mode APD arrays using curve-fitting of signal decay," in 2008 IEEE Nuclear Science Symposium, Feb. 2008, pp. 1416-1418.

I. Weinberg, P. Stepanov, P. Abshire, D. Sander, A. Weinberg, and M. Dandin, "Improving SNR of radiation detector readout electronics," J. Nucl. Med., vol. 49, No. S1, p. 408P, May 2008.

I. Weinberg, P. Cheng, K. H. Wong, K. Cleary, P. Abshire, V. Saveliev, M. Dandin, L. G. Gruionu, "PET-enabled glove for molecular image-guided surgery," J. Nucl. Med., vol. 48, No. S2, p. 163P, May 2007.

M. Dandin, P. Abshire, and E. Smela, "Polymer filters for ultraviolet-excited integrated fluorescence sensing," J. Micromechanics Microengineering, vol. 22, No. 9, p. 095018, Sep. 2012.

M. Dandin, P. Abshire, and E. Smela, "Optical filtering technologies for integrated fluorescence sensors," Lab Chip, vol. 7, No. 8, p. 955, Jul. 2007.

H. Ji, M. Dandin, P. Abshire, and E. Smela, "Integrated fluorescence sensing for lab-on-a-chip devices," in 2006 IEEE/NLM Life Science Systems and Applications Workshop, Jul. 2006, pp. 1-2.

D. Sander, M. Dandin, H. Ji, N. Nelson, and P. A. Abshire, "Low-noise CMOS fluorescence sensor," in 2007 IEEE International Symposium on Circuits and Systems, Jun. 2007, pp. 2007-2010.

\* cited by examiner

100

400

500

800

900

1100

1300

1400

1500

READOUT SYSTEMS AND METHODS BASED ON A COINCIDENCE THRESHOLD

CROSS-REFERENCE TO RELATED APPLICATIONS

The present application is a continuation of U.S. patent application Ser. No. 15/588,576, filed on May 5, 2017, which is a divisional application of U.S. patent Ser. No. 14/735,105 filed on Jun. 9, 2015, now U.S. Pat. No. 9,702,758, which claims priority from U.S. Provisional Patent Application No. 62/009,887, filed on Jun. 9, 2014, the contents of which are incorporated herein by reference in their entirety.

TECHNICAL FIELD

The present disclosure generally relates to methods, systems, architectures, and devices for reading out pixel arrays. More particularly, the present disclosure relates to a readout architecture.

BACKGROUND

Currently available readout architectures may suffer in performance when they are used with arrays of event-driven pixels that exhibit high activity levels. In the state-of-the-art, whether a readout architecture is based on a purely digital, purely analog, or mixed-mode signaling scheme, high throughput and accurate coincident event detection cannot be achieved without compromising circuit complexity.

SUMMARY

The embodiments described herein help mitigate and/or solve the aforementioned issues, as well as other issues known in the art. For example, and not by limitation, the embodiments described herein provide readout architectures capable of leveraging the advantageous aspects of both digital and analog readout schemes into the same readout chain. An exemplary embodiment is briefly described below. Additional embodiments, or modifications thereof, will be readily apparent to persons skilled in the relevant art(s) based on the teachings provided in the entirety of this disclosure.

In the present disclosure, exemplary circuit embodiments and their corresponding method embodiments are provided for use with a plurality of pixels. The embodiments may include representing the activity of least two pixels as at least two digital signals. The embodiments may include dynamically aggregating the at least two digital signals into one representative analog signal corresponding to a collective activity of the at least two pixels. The analog signal may then be converted to a digital signal representing the collective activity of the at least two pixels.

Additional features, modes of operations, advantages, and other aspects of various embodiments are described below with reference to the accompanying drawings. As will be evident from the teachings provided herein, the scope of the present disclosure is not limited to the specific embodiments shown in the drawings, which are presented for illustrative purposes only.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings.

Figure 1:
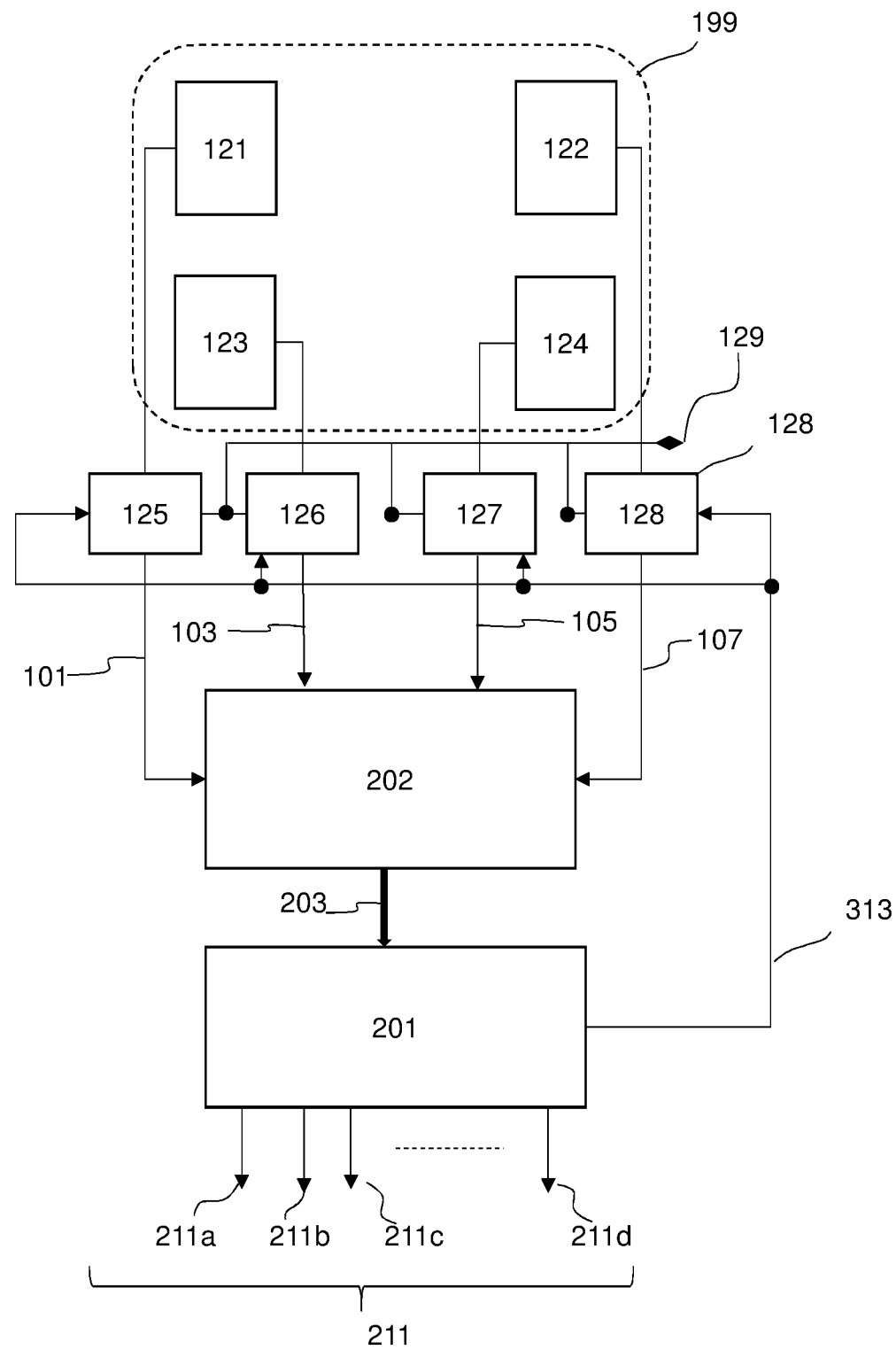
FIG. 1 is an illustration of a device according to an exemplary embodiment.

The above-referenced drawings are only for purposes of illustrating the embodiments and are not to be construed as limiting the present disclosure. Given the following enabling description of the drawings, the novel aspects of the present disclosure should become evident to a person of ordinary skill in the relevant art(s).

DETAILED DESCRIPTION OF THE DRAWINGS

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

In the present disclosure, a pixel may be a single-photon avalanche diode (SPAD), which is a device that, barring any noise considerations, behaves as a digital photon-triggered switch. This switch can be reset by applying a signal on a dedicated terminal of the SPAD. Stated otherwise, in the absence of noise, when no light is incident on a SPAD, there is no signal observable at its output terminal, i.e. the SPAD is in its OFF state. Once it is triggered by a photon, the SPAD produces an electrical signal, corresponding to an ON state. The SPAD is then reset by asserting a signal on the dedicated terminal in order to bring the output terminal to an OFF state so that another photon can be detected. Now, when considering the presence of noise, the SPAD is triggered and reset the same way as described above, but instead of being triggered only by photons, it can also be triggered by a non-photon correlated carrier generated in or transported to the avalanching region of the junction.

Accordingly, because of that inherent ON/OFF behavior, a purely digital readout architecture would seem the most obvious choice for reading out signals from a SPAD array, since it readily affords simplicity and some degree of noise immunity. However, this is not the case: the performance of typical digital readout architectures for SPAD arrays is severely limited, especially for applications where coincidence-based detection is required.

For example, transmitting two digital pulses on the same readout line (each pulse originating simultaneously from different SPADs) cannot be achieved without losing the ability to ascertain that the two SPADs were active at the same time. In other words, the degree of coincidence (i.e. temporal correlation) between pixels cannot be ascertained in such a system. This is a key limitation in applications like radiation dosimetry, or generally speaking, in SPAD array configurations where temporal correlation is used as a means to filter out uncorrelated noise processes. It is noted that the term simultaneously is used herein to mean that the two pulses are originated within a predetermined time window, i.e. within a predetermined coincidence threshold.

Further, it is noted that resource sharing in typical digital systems is typically a synchronous process whereas SPADs are asynchronous in nature since their activity depends on a photo-generated carrier (or a non-photon related carrier) arriving in the avalanche region. As such, SPADS are event-driven systems. Therefore, digital readout across a shared medium essentially results in loss of temporally correlated signals originating from two or more SPADs in the array. While losses can be mitigated by the degree of sharing implemented using asynchronous digital readout schemes like address-event representation (AER), these techniques inherently increase circuit complexity without an appreciable improvement in loss. Typical digital readout architectures are therefore intrinsically ill-suited as a transmission platform for systems having large arrays of event-driven pixels, such as SPADs.

An analog readout architecture, on the other hand, is inherently asynchronous and can support dynamic data transmission without rate or timing constraints. As such, conceptually, an analog architecture would represent an optimal signal encoding means for an array of independently firing pixels.

For example, a typical silicon-photon multiplier (SiPM) configuration exploits the inherent advantage of analog technology as it relates to the dynamic aspect of SPAD operation, and it is especially relevant for large SPADs arrays. In typical SiPM detectors, the analog readout architecture allows constraint-free dynamic signal transfer from multiple micro-pixels (each including a SPAD) to a common output node across a shared path, thus offering maximum operational parallelism using a single readout channel. The effective transmission bandwidth is comparable to having a dedicated readout channel for each SPAD device. The ability to dynamically represent different patterns of parallel activity across multiple micro-cells on a single readout node has been the key attribute responsible in making SiPMs the SPAD-based single-photon detector of choice in radiation detection.

Nevertheless, the analog approach has important shortcomings. Although it enables a very simple scheme for dynamic encoding of the signal at the array-level, it displaces all the imprecision and complexity from the signal encoding level to the signal decoding level. The robust digital voltage response of a typical SPAD device is replaced by an analog signal that is highly susceptible to noise. Thus, the electronic extraction of the relevant information from the analog response of the SiPM detector introduces many challenges that ultimately constrain the performance of the detector and limits its use in many applications. In that respect, typical purely analog readout schemes, like their digital counterparts, are also ill-suited for SPAD arrays.

Embodiments of the present disclosure circumvent the aforementioned issues, in addition to providing other advantages that will be apparent to one of skill in the art. For example, the present disclosure provides a novel paradigm for signal encoding that has architectural simplicity and a dynamic readout while minimizing noise and the extent of signal processing required.

FIG. 1 illustrates a device 100 according to an embodiment. Device 100 includes a pixel array 199 comprising pixels 121, 122, 123, and 124. While only four pixels are shown, it is noted that the size of the array can differ from the size shown herein without departing from the scope of this disclosure; in actuality, pixel arrays with which the novel encoding paradigm taught herein can be used may include tens, hundreds, or thousands of pixels. In such cases, each pixel would be configured as shown herein for pixels 121-124, i.e. using the same ancillary circuits and netlists shown in FIG. 1. It is also noted that while activity of a pixel is described in terms of photon arrival, non-photon related processes can also trigger activity. As such, activity of a pixel can generally be construed herein as the pixel exhibiting a measurable signal at an output node. It is also noted that in the many timing diagrams shown herein, the x-axis is to be construed as increasing time (from left to right) and the y-axis is typically voltage.

Further, it is noted that while the descriptions from hereon in are provided with respect to a SPAD pixel or SPAD pixels, other pixel architectures and pixel arrays are also contemplated. For example, another type of pixel can be an avalanche photodiode (APD) that uses an in-pixel digitizer, an active a pixel sensor (APS) that uses an in-pixel digitizer, or a silicon neuron that outputs a digital signal. Generally speaking, a pixel maybe construed herein as a photodetector or as an event-driven module (e.g. a silicon neuron).

Device 100 includes digitizer circuits 125, 126, 127, and 128, each being coupled to one pixel of array 199. In cases where array 199 is an array of SPADs, the digitizer circuits 125-128 may be active quenching and reset circuits that are used to quench and reset an avalanche current occurring in a corresponding pixel. Further, digitizer circuits 125-128 may each include a control terminal 129 that can be used to control the pulse width at the output of each digitizer circuit. Furthermore, while the components of device 100 are delimited in specific blocks for ease of description, other configurations that do not have such delimitations are contemplated. For example, pixel 121 may include digitizer 125 as well as the corresponding capacitor in circuit 202 (FIG. 2) and any other intermediate circuits.

When a photon is absorbed in pixel 121, an avalanche current may rise in pixel 121. The leading edge (in time) of that current corresponds to the arrival of the photon in pixel 121. Digitizer circuit 125 is configured to quench the current and reset the pixel 121 for subsequent photon detection. Moreover, digitizer 125 is also configured to generate a digital voltage pulse whose leading edge corresponds with that of the avalanche current, i.e. with the arrival of the photon that triggered the avalanche. The width of the voltage pulse (on line 101) has no meaning with respect to the photon arrival time since only the rising edge of the pulse is useful. The same considerations apply to pixels 123-124, digitizers 126-128, and lines 103, 105, and 107.

While the pulse width has no bearing on the number of photons arriving in a single pixel, the exemplary embodiments make use of that width to set a coincidence threshold when considering at least two pixels. For example, utilizing terminal 129, each of digitizer circuits 125-128 can be configured to have a predetermined output pulse width. For example, if the pulse width is set to be 50 nanoseconds (ns), simultaneity between two pixels is when they fire less than 50 ns apart. Conversely, if the predetermined pulse width is made to be 1 microsecond (μs), simultaneity between two pixels is when they fire less than 1 microsecond (μs) apart. As such, the present disclosure provides means for adjusting a coincidence threshold simply by adjusting the pulse width at the output of each of digitizers 125-128 using terminal 129. A digitizer circuit, as contemplated in the present disclosure, may be achieved with an active quenching circuit (AQC) as is known in the art. A circuit such as a toggle flip-flop with a delay element in its feedback loop may be used to shrink or expand the pulse width of the output of the AQC using a control terminal such as terminal 129.

Output lines 101, 103, 105, and 107 correspond respectively to digitizers 125, 126, 127, and 128, and they are fed to a readout interface circuit 202. The readout interface circuit 202 is configured to generate a discrete-valued analog signal 203, which represents the collective behavior of pixels 121, 122, 123, and 124. In other words, signal 203 is a dynamically aggregated signal that corresponds to the activity of array 199 during a given time period. As shall be seen below, signal 203 encodes coincidence information as well as information relating to how many pixels fired simultaneously given a coincidence threshold and a photo detection threshold. Signal 203 is fed to a digitizing circuit 201 that produces a count 211 (bits 211a-211d) representative of the number of pixels that fired within the given coincidence threshold. Circuit 201 is configured to control digitizers 125-128 via line 313 and based on a number of photons counted, i.e. based on a photon count threshold which may be externally set, as shall be in explained later.

Figure 2:
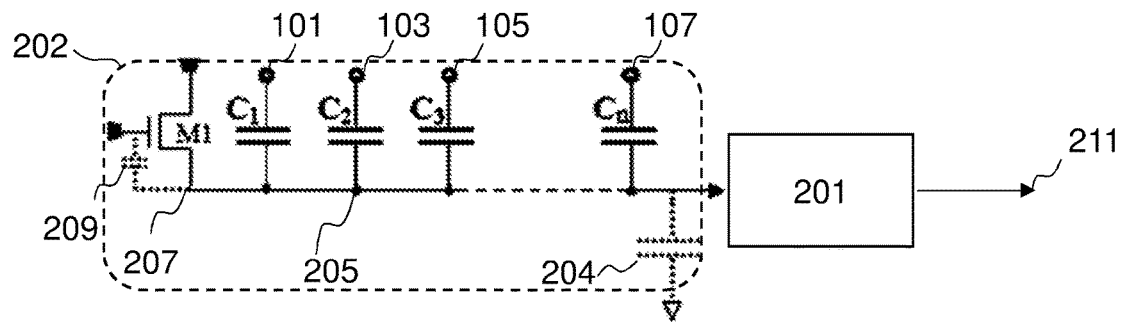
FIG. 2 is an illustration of an interface circuit according to an exemplary embodiment.

FIG. 2 is an illustration of readout interface circuit 202, according to an embodiment 200 in which digital outputs of the pixels (i.e. pulses on lines 101, 103, 105, and 107 In FIG. 1) are capacitively coupled to a shared floating node (i.e. node 205). As configured, readout interface circuit 202 dynamically converts the simultaneous digital activity on its input ports into a representative discrete-valued signal at its output port (signal line inputting circuit 201). This is done by a direct weighted summation of temporally correlated input pulses.

In a complementary-metal-oxide semiconductor (CMOS) process, the interface capacitors C1, C2, C3, and Cn can be achieved using poly/poly, metal/poly, or metal/metal layers. They can also be achieved using MOS capacitors or any other suitable topology that produces an explicit capacitor.

In one embodiment, the bottom plates (i.e. the plates tied to node 205) of the capacitors are connected together to form the floating output node 205 of the interface circuit. According to the charge conservation law, the charge trapped on an isolated (floating) node is redistributed among all the connected capacitors in response to signal transitions on a capacitively coupled neighboring nodes, but the total amount of charge remains the same before and after the signaling. Therefore, in reference to FIG. 2, when a pixel fires in array 199 the electrical energy of the signal is converted to an electrostatic charge induced on the top plate of the corresponding coupling capacitor. Accordingly, an equivalent amount of charge, of opposite polarity, is redistributed on the floating bottom plate. As such, a system of charge distributes itself in such a way to minimize the electrostatic potential energy of the system. Assuming the initial trapped charge, Q0, is zero and the total parasitic capacitance from all transistor driven by the floating sense node is $C_P$, the resulting charge relation at node 205 is expressed by Equation (1).

$$Q_0 = C_1(V_{fn} - V_1) + C_2(V_{fn} - V_2) + \ldots + C_n(V_{fn} - V_n) + C_P V_{fn} \qquad (1)$$

The change in the floating node voltage in response to the signaling activity on the coupled input ports is represented by the parameter Vfn. C1 through Cn are the equal-sized input coupling capacitances and V1 through Vn represent the corresponding voltage pulses on output lines 101, 103, 104, and 107, respectively. The equivalent capacitance seen at node 205 is equal to the sum of all the input coupling capacitances plus the effective parasitic capacitance at node 205 arising from capacitors 204 and 209. This is expressed in Equation (2).

$$C_1 + C_2 + \ldots + C_n + C_P = C_T + C_P \qquad (2)$$

Using Equations (1) and (2), the voltage at node 205 can be expressed as shown in Equation (3) below.

$$V_{fn} = \frac{C_1 V_1 + C_2 V_2 + \ldots + C_k V_k}{C_T + C_P} \qquad (3)$$

In Equation (3), the subscript k represents the number of triggered inputs out of n connections to readout interface circuit 202 from array 199, i.e. from n pixels. It is observed from Equation (3) that Vfn is proportional to a factor $C_T/(C_T + C_P)$, where $C_T$ is the total capacitance at node 205, which suggests that the parasitic capacitance $C_P$ (with charge $Q_P$) effectively reduces the induced voltage Vfn. Therefore, the induced voltage on node 205 can be expressed as a linear combination of voltage transitions on the input coupling ports (lines 101, 103, 105, and 107) scaled by the total number of connections (4 in FIG. 2), minus the voltage from the induced charge on the parasitic capacitance. Equation (4) provides an expression for the induced voltage as a result of parallel activation (i.e. simultaneous firing) of k pixels.

$$V_{fn} = \frac{1}{n} \sum_{i=1}^{k} V_i - \frac{Q_P}{C_T} \qquad (4)$$

From the above analysis, it can be seen that the floating sense node (i.e. node 205) is essentially a charge sharing interface at which input signals (lines 101, 103, 105, and 107) couple capacitively. Further, voltage Vfn at the sense node is a function of the charge division that occurs between capacitors connected to node 205 minus the charge induced on the parasitic capacitance.

Further, it is noted that that the scaled voltage summation at the floating node is not restricted to a particular coincidence threshold. This is because the threshold can be adjusted by varying the pulse width of the output signal associated with digitizers 125-128 in FIG. 1.

Furthermore, it is noted that the quiescent charge on an isolated (floating) node such as node 205 is not predictable or controllable because charges may be trapped on the node during fabrication process. Thus, the node's DC quiescent state (i.e. when there is no activity on the inputs) is undefined. Therefore, in order to set the initial voltage condition of the floating node to a known reference value, a high impedance path to a reference voltage is provided for the output floating node.

In FIG. 2, this is accomplished using transistor M1. In an embodiment, transistor M1 is a NMOS that is grounded to set the high impedance path. One terminal of transistor M1 (e.g. the drain of M1 in FIG. 2) connects to a fixed predetermined and arbitrary non-zero potential which serves as a reference voltage level for the induced voltage variations on node 205 (i.e. the photon detection threshold). Terminal 207 of M1 (i.e. the source of M1 in FIG. 2) is tied to node 205, and the gate of M1 is grounded to ensure cut-off mode, thus providing the high impedance path from node 205 to the node at which the predetermined potential exists, i.e. to the drain of M1. This predetermined potential may be set to gnd in some embodiments.

In the novel signal processing scheme described above, signal encoding does not involve integration of charge as a means for representing an event, as would be the case in a typical active pixel sensor. As such, the dynamic range of the output detector signal is not restricted by the charge handling capacity of the interface electronics. Rather, the active range of the detector signal is inherently tuned to operating voltage (gnd to VDD) and cannot exceed it.

Further, the detector signal amplitude is a direct indication of the number of coincident photons detected and not a proxy quantity that is proportionally related to the detected photon count. The raw detector signal exhibits a flat top profile that is directly available for digitization without requiring further shaping or conditioning. This significantly simplifies the readout chain by excluding the several signal conditioning components required in typical analog readout systems.

Furthermore, the slope of the signal at node 205 is the same regardless of the signal amplitude. As a result, the time walk effect, a major source of timing uncertainty in the standard analog readout, is eliminated. Additionally, the performance of this novel architecture is unaffected by the performance constraints typically associated with increasing the number of interconnections in a shared access configuration. In other words, in the embodiments described herein there is no data transfer delay, no increased power consumption and no decreased bandwidth.

Figure 3:
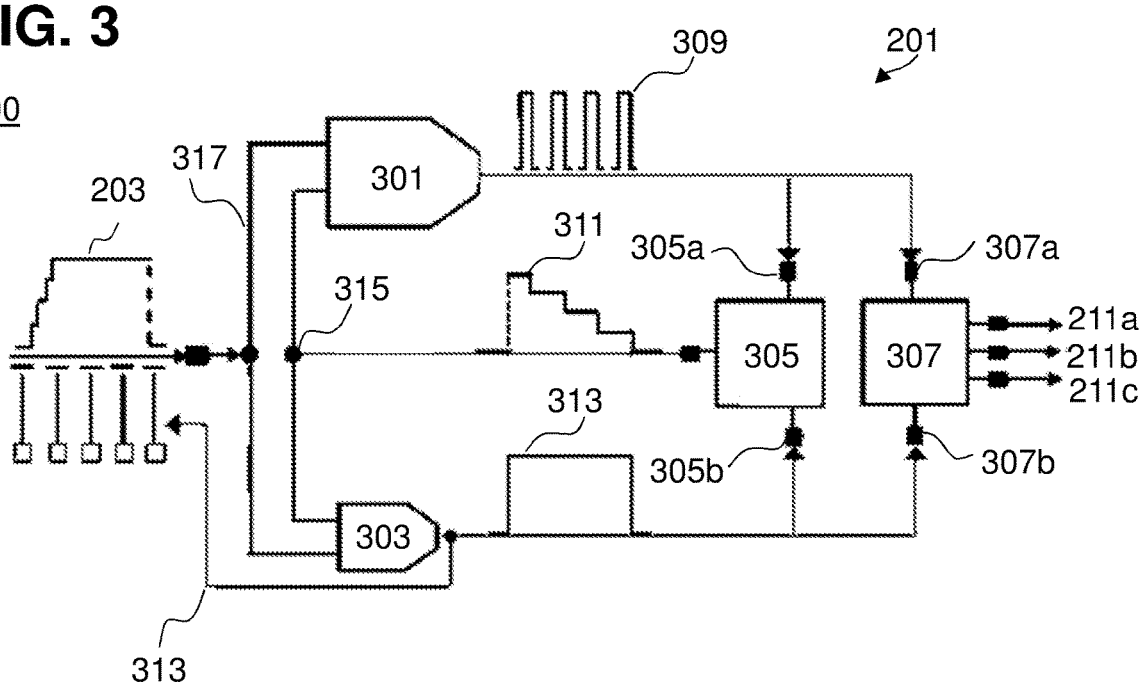
FIG. 3 is an illustration of a circuit according to an exemplary embodiment.

Turning now to FIG. 3, an exemplary embodiment 300 of digitizer circuit 201 is described in detail. Circuit 201 includes a high-speed pulse-mode comparator 301, a dynamic pulse adder 305, an m-bit counter 307 (m=3 in FIG. 3), and a comparator 303. Discrete-valued analog signal 203, which is representative of the dynamic activity of pixels 121-124, is fed to the positive terminal 317 of comparators 301 and 303. Adder 305 is configured to produce an adaptive reference voltage 311 using the serial pulse train 309 at port 305a, and comparator 303 is configured to provide a control signal 313 to digitizers 125-128 (see FIG. 1). The purpose of this control or reset signal will be described later with respect to FIGS. 12A, 12B, and 13.

Figure 14:
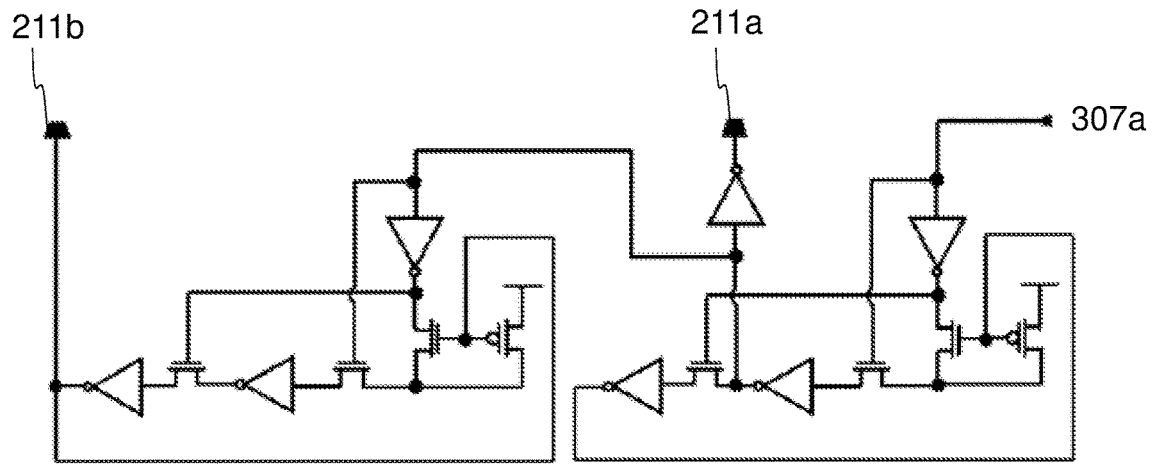
FIG. 14 is an illustration of a counter according to an exemplary embodiment.
Figure 15:
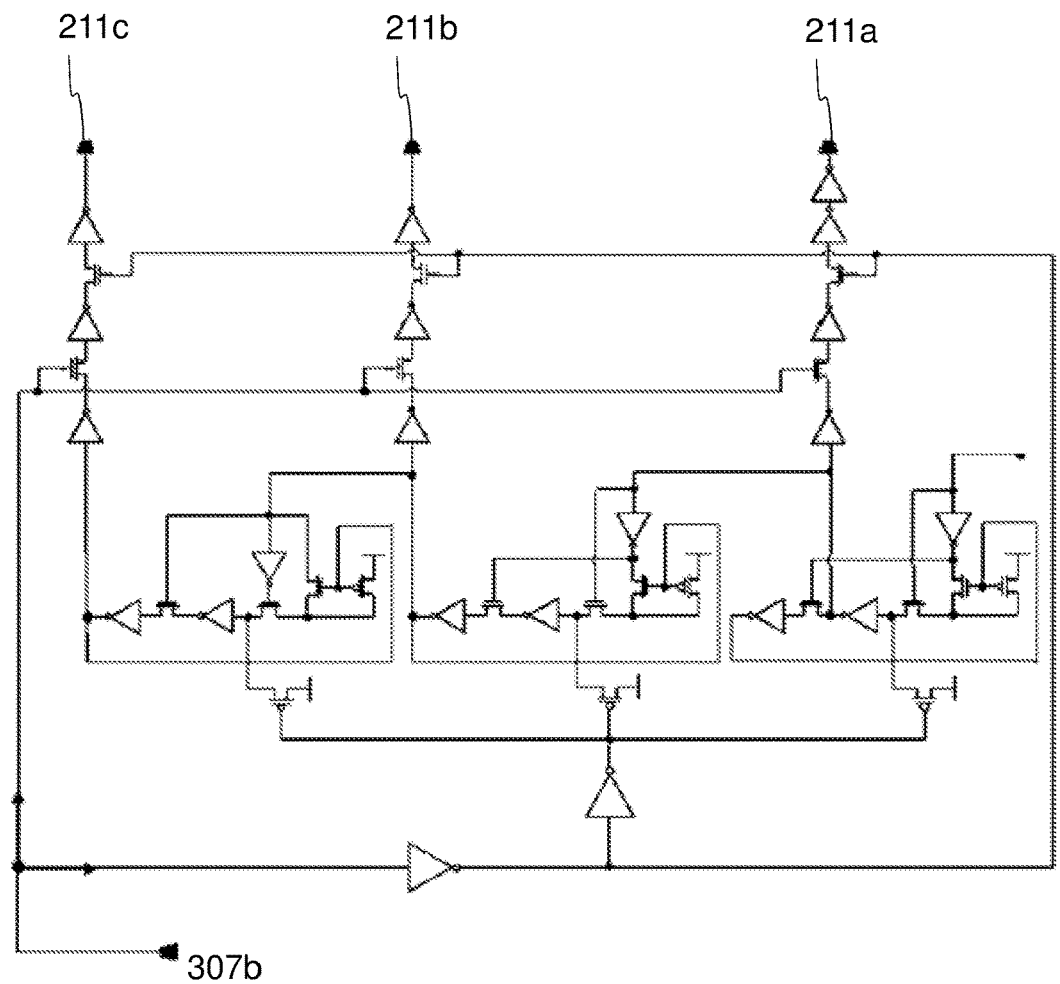
FIG. 15 is an illustration of another counter according to an exemplary embodiment.

Comparator 301 is configured to represent the analog signal 203 as a serial pulse train 309, thus effectively converting the parallel activity of pixels 121-124, within a given coincidence threshold, into a serial representation. Pulse train 309 is provided to input port 307a of counter 307, which produces digital word 211 (see FIG. 2) comprising bits 211a, 211b, and 211c, of which 211a is designated herein, without loss of generality, as the least significant bit of the digital word 211. Digital word 217 represents the number of photons (or events to be general) that are coincident on the pixel array, the degree of coincidence being selected by the coincidence threshold discussed above. Counter 307 is dynamically reset at input port 307b when a number of photon threshold count is reached. In some implementations, counter 307 may have no reset terminal, in which case the output of comparator 303 would only go to input port 305b of adder 305. Exemplary embodiments 1400 and 1500 of counter 307 are shown in FIG. 14 (no reset, only 2 bits shown) and FIG. 15 (with reset), respectively.

Figure 5:
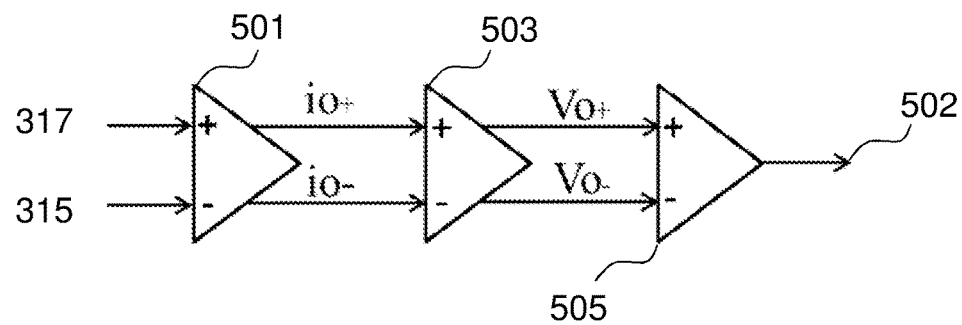
FIG. 5 is an illustration of a comparator architecture according to an exemplary embodiment.

Exemplary implementations of comparators 301 and 303 are discussed below with respect to FIGS. 5-8. A general architecture 500 for the comparators is shown in FIG. 5. Each of comparators 301 and 303 includes an input stage 501, a decision stage 503, and an output stage 505. Further, each of comparators 301 and 303 includes a positive terminal 317, to which is provided the analog signal 203, and a negative terminal 315 to which is provided the adaptive reference signal 311. The output of the comparators is noted 502 in FIG. 5, but with reference to comparators 301 and 303 (FIG. 3), output 502 corresponds to signal 309 for comparator 301 and signal 313 for comparator 303.

Figure 6:
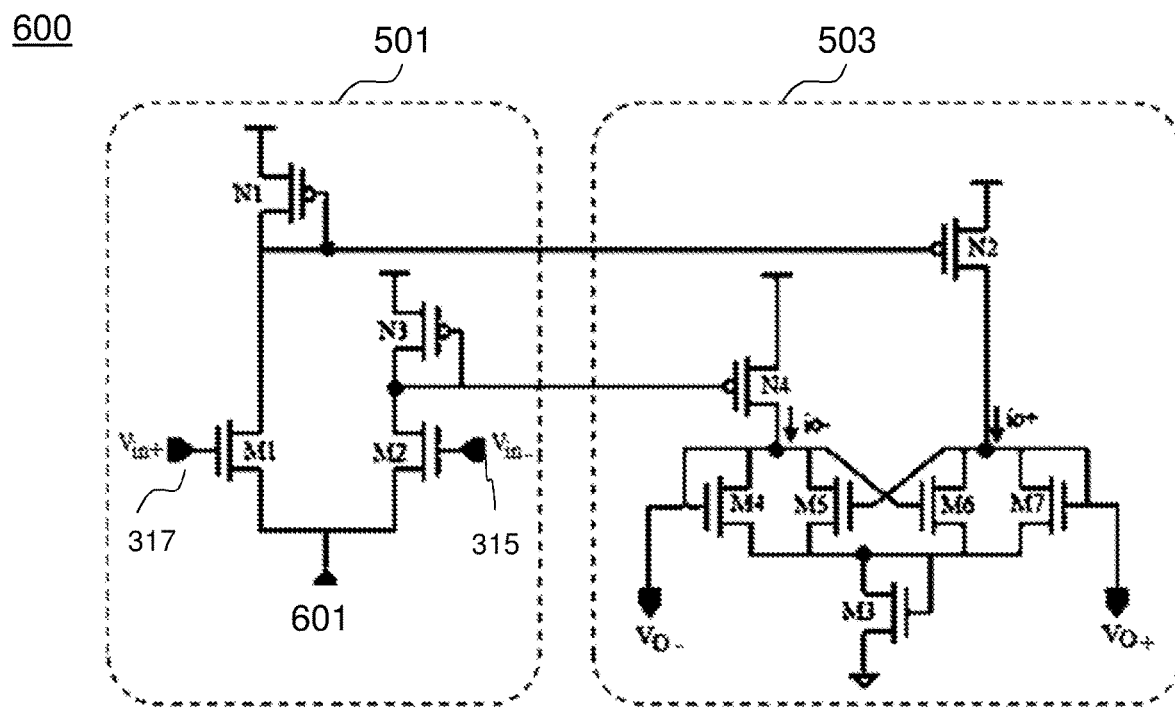
FIG. 6 is an illustration of a portion of the exemplary comparator of FIG. 5.
Figure 7:
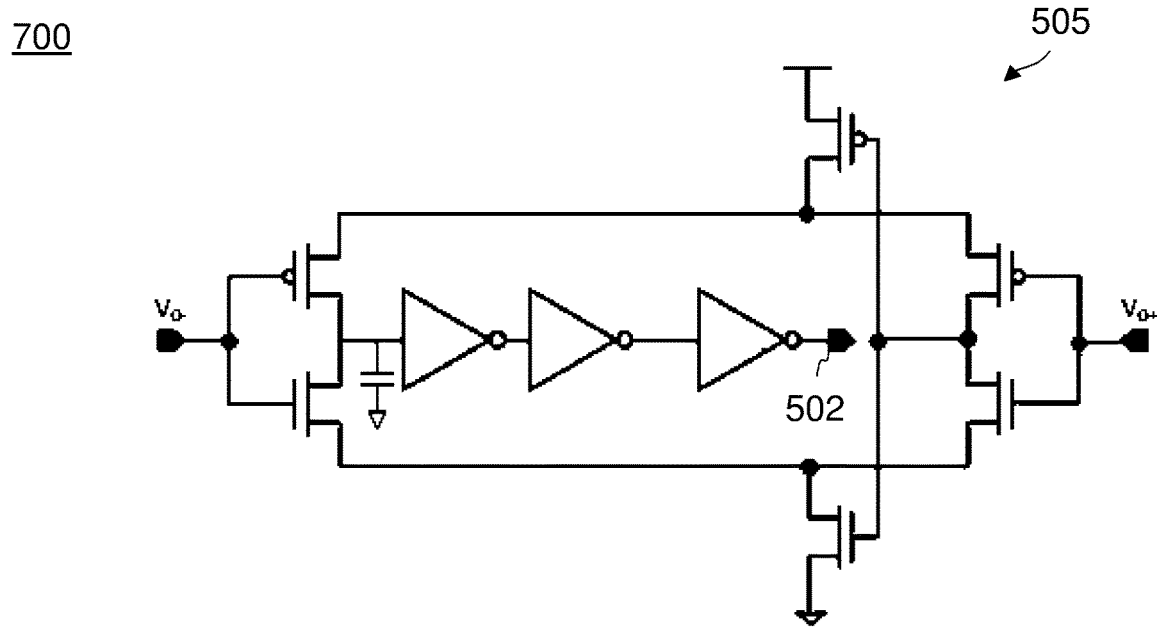
FIG. 7 is an illustration of another portion of the exemplary comparator of FIG. 5.
Figure 8:
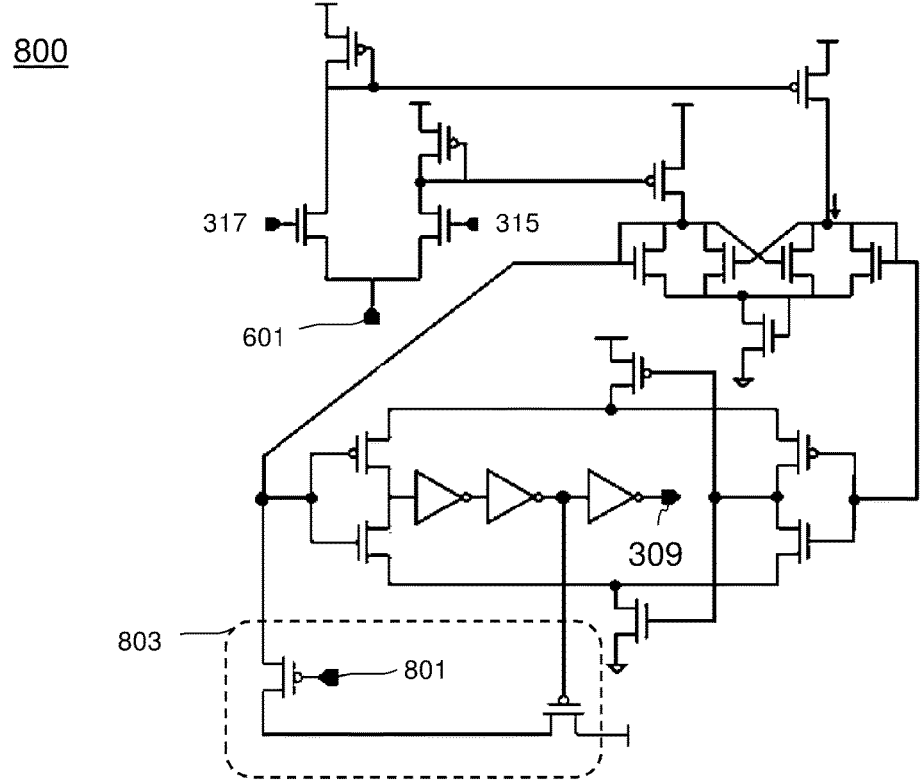
FIG. 8 is a circuit level illustration of the comparator of FIG. 5.

An exemplary embodiment 600 of input stage 501 and decision stage 503 is shown in FIG. 6. Input stage 501 may be implemented with a differential pair that is biased with a current at terminal 601 and equipped with active loads to set a predetermined transconductance. Further, decision stage 503 may be implemented using cross-coupled decision cells. FIG. 7 shows an embodiment 700 illustrating an output stage. And lastly, FIG. 8 shows all the three aforementioned stages put together in an exemplary embodiment 800 of comparator 301. Comparator 303 has a similar architecture as with embodiment 800, the only difference being that comparator 303 does not use feedback loop 803. In comparator 301, feedback loop 803 is used to generate a pulsing output, and the duty cycle of each of the pulses (i.e. the pulses of signal 309), can be controlled using bias voltage 801.

Figure 9:
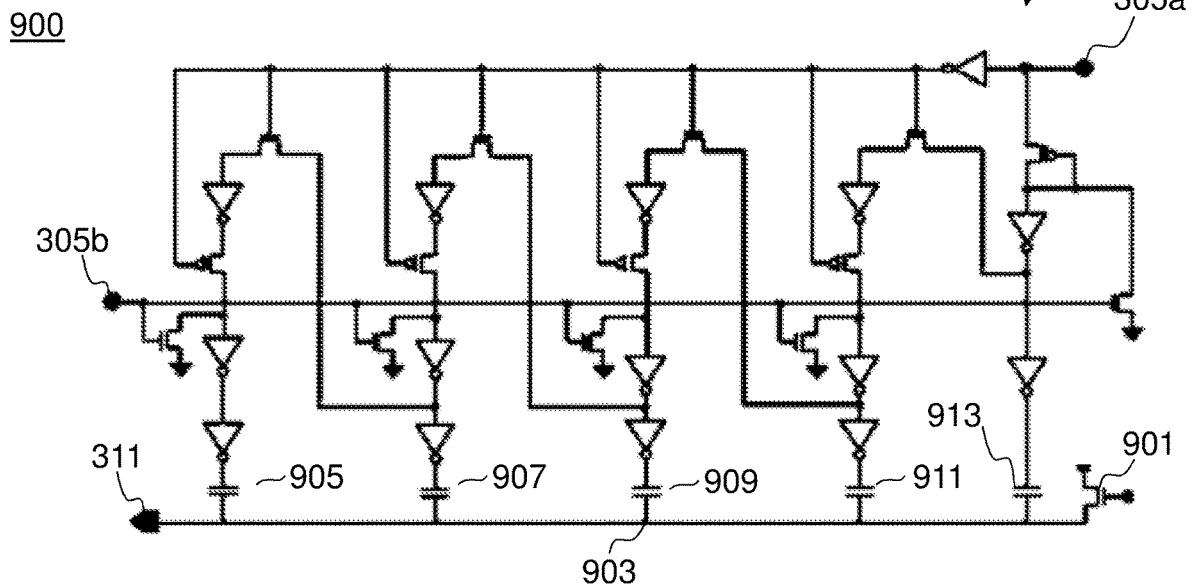
FIG. 9 is an illustration of a readout circuit component according to an exemplary embodiment.

FIG. 9 represents a schematic illustration 900 of an exemplary discrete signal pulse adder 305, in accordance to one embodiment of the present disclosure. The exemplary adder 305 comprises an input port to receive the serial pulse train 305a from output of the comparator 301. In response to each sequentially arriving pulse form the serial pulse train 309 at terminal 305a, a drive signal is routed to an immediately available consecutive capacitive coupling node (905-913). The capacitive coupling nodes 913, 909, 907 and 905 are driven high successively in response to the incoming pulse stream. Since all the coupling capacitors are of equal size (within the mismatch parameter of the technology process) each incoming pulse induces approximately the same step rise on the reference sense node 903. The successive activation of coupling nodes sequentially increment the adaptive reference signal 311 at the output of adder 305. Adaptive reference signal 311 is routed as the tracking signal to the adaptive reference port of the high-speed pulse mode comparator (HSPC) 301. The tracking signal is continuously incremented in response to each pulse arrival in the serial pulse train 309 until its magnitude exceeds the magnitude of the voltage signal 203 on the sense node 205. At that point, the serial pulse train 305a is terminated and the reset (or control) signal 313 is asserted on terminal 305b is initiated, concurrently deactivating the internal capacitive coupling ports 905-913 in preparation for the next extraction event.

The photon detection threshold (typically a predetermined non-zero voltage) is set externally at the drain of transistor 901.

Figure 10:
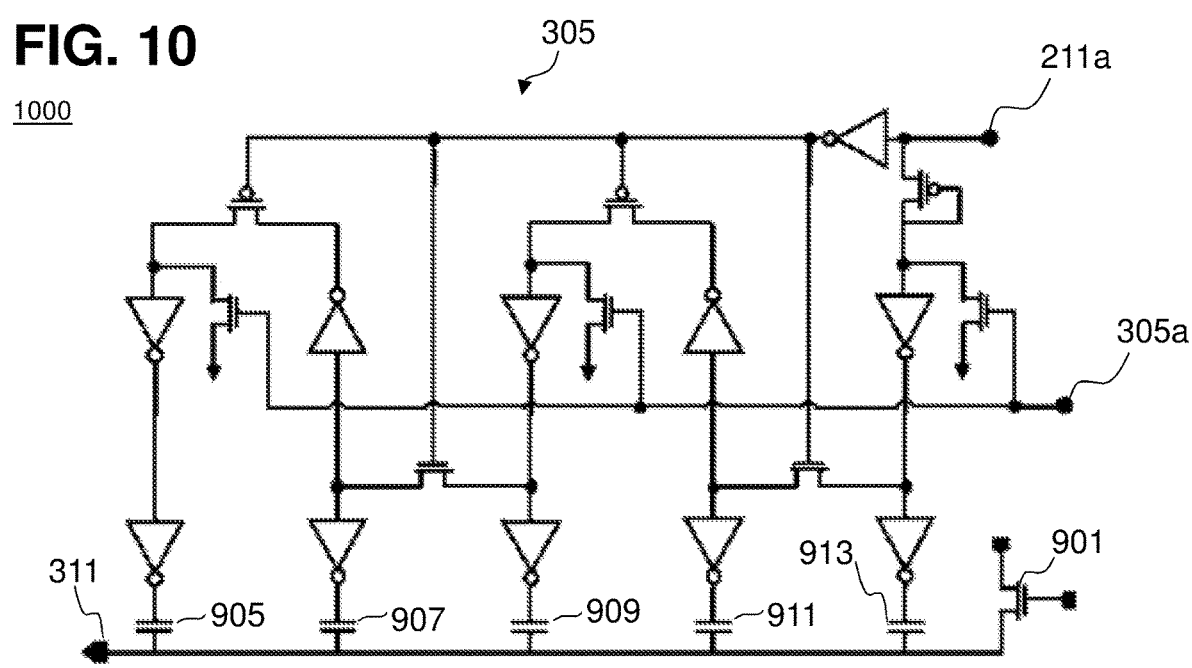
FIG. 10 is an illustration of another readout circuit component according to an exemplary embodiment.

In accordance with another embodiment of the present disclosure, a more compact adder 305 implementation 1000 is schematically illustrated In FIG. 10. Adder module 100 is driven by signal transitions generated on the least significant bit (LSB) line 211a of the digital counter 307, rather than by the pulses from the serial pulse train at the output comparator 303. Due to its more compact architecture, implementation 1000 may be used in configurations utilizing a digital counter for generating a binary word representation of count information. Since each signal transition of the digital counter LSB signal corresponds to a distinct event pulse, the adder 305 output voltage, in this configuration, must increment on every transition of the input signal.

Furthermore, in implementation 1000, adder 305 half as many transistor switches for successively routing a drive signal to coupling nodes 905-913 in response to input signal transitions 211a. Hence implementation 1000 presents less loading on the transitioning input signal 211a, and, consequently, due to fewer number of reset transistors, less loading on the control signal 305a during reset operation.

Having set forth the structure of circuit 201, a discussion is now provided with respect to its operation (FIGS. 4 and 10) as it relates to its various constituent components. Referring to FIG. 3, the output of comparator 301 is triggered high when signal 203 exceeds a predetermined threshold. Specifically, comparator 301 generates a continuous stream of narrow pulses while signal 203 remains higher than the adaptive reference voltage 311 on terminal 315. The generated pulses (signal 309) are subsequently added by adder 305. The operation is carried out by the same method of charge redistribution used to generate the signal on the detector interface, i.e. with a circuit similar to readout interface circuit 202 in FIG. 2. The difference is that instead of the multiple parallel input lines (101, 103, 105, and 107 in FIG. 1), adder 305 only has a single serial input line (signal 309). Adder 305 processes each incoming pulse to an immediately adjacent open coupling port by sequentially stepping through the capacitor array (see FIG. 9).

In FIG. 3 the output of adder 305 is connected to the negative terminal of comparator 303. Therefore the DC bias of adder 305 provides the discrimination threshold for filtering noise events. As such, signal 311 is an adaptive reference voltage that tracks signal 203 in discrete increments. Once signal 203 is exceeded by signal 311, comparator 301 terminates the pulse stream 309.

The interface output voltage (signal 203) moves in accordance to the signal transitions on at node 205. However since events are represented by digital pulses, each step rise in the signal 203 (see FIG. 4) will eventually be followed by a step reduction from the falling edge of the corresponding pulse. This is useful in the case of temporally uncorrelated noise events that do not trigger a counting cycle, as it ensure that the associated interface response is quickly diminished.

Figure 4:
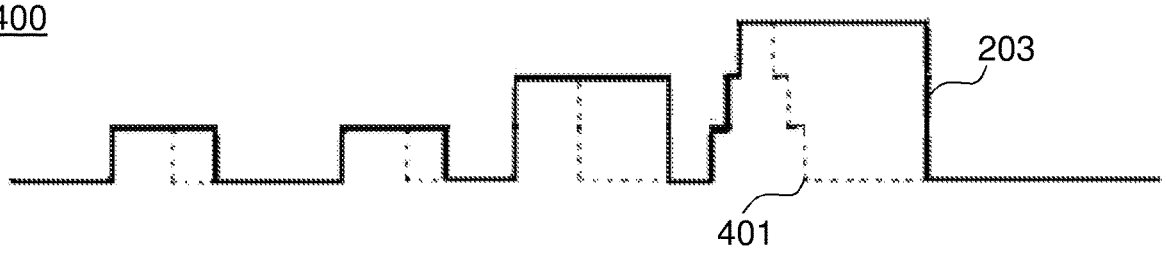
FIG. 4 is a timing diagram of the operation of a device according to an exemplary embodiment.
Figure 4:
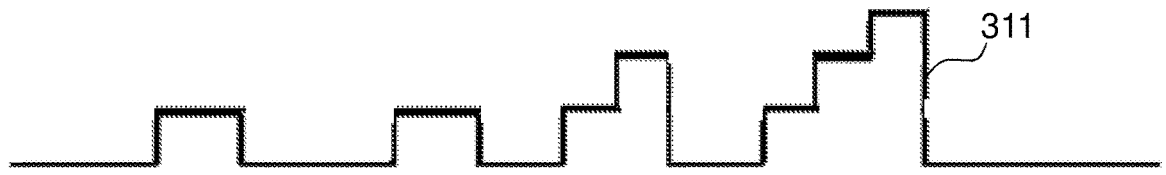
Figure 4:
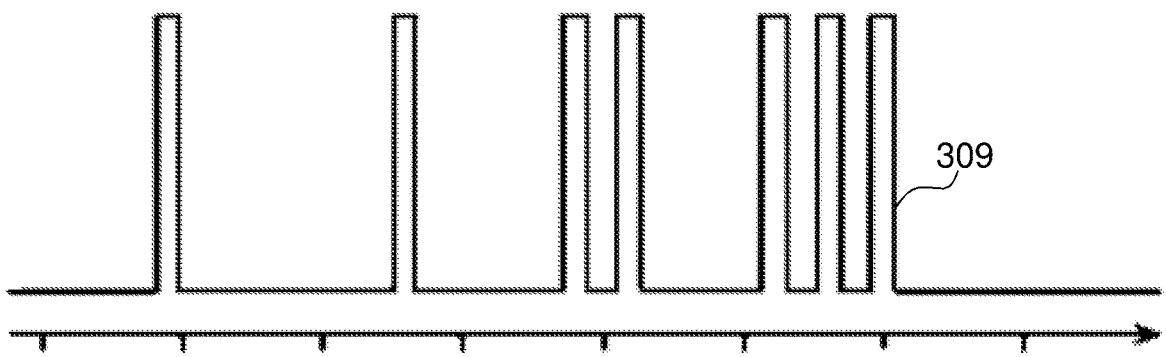

FIG. 4 illustrates a typical signal profile 400 for internal signals of circuit 201 generated in response to four events where the first two events comprise a single photon each and the third event comprises two simultaneously arriving photons, and the fourth event comprises three near-simultaneously arriving photons, with enough temporal proximity for the associated digital photo-response to overlap. The dynamic behavior signal 203 in response to the aforementioned events is shown by waveform 203. The waveform 401 illustrated by a dashed line represents the falling edge of the interface (node 205) voltage as it would show in response to falling edge of the pulses at the input ports of the interface, i.e. if the detection threshold was not crossed. During a valid detection event, signal 203 must be prevented from decaying in response to falling edge of incoming pulses. This is achieved using the circuits of FIGS. 12A, 12B, and 13, which are described in greater detail below. Either of these circuits can be used to isolate the interface signal 203 until a number of discrete increments corresponding to the number of pulses in serial pulse train 309 has been determined. This is the number required for the tracking signal (311), i.e. the adaptive reference provided by adder 305, to equal or exceed signal 203. When such a condition is met, signal 203 may be released to fall or rise to a voltage level determined by the level input digital activity at the particular point in time. At that point, signal 203 must be reset in order for sense node 205 signal amplitude tracking to start anew, i.e. for detecting the next event crossing the detection threshold.

When multiple pixels fire in parallel, the rising edge of their corresponding output pulse line up (within the coincidence threshold) to induce a proportional rise in the interface voltage (biased floating node) that may exceed the detection threshold and trigger the counting process. As stated above the counting process terminates when the amplitude of the interface signal is exceeded by the tracking signal. Therefore any drop in the interface voltage level (in response to falling pulse edges), prior to the completion of the counting process could prematurely terminate the serial pulse stream and distort the count measurement. As a result, while the count extraction process is in progress at node 205, its level must not be allowed to drop. Exemplary embodiments for preventing this issue are discussed below.

Successful digital extraction of the count 211 is contingent upon preventing amplitude level drops at node 205 due to falling edges (see signal 401 in FIG. 4). To circumvent this issue, the signal at node 205 may be held using a transistor switch in series with a storage capacitor, as would be typically used in a track-and-hold circuit for peak detection in a standard ADC system. However, this approach suffers from inherent non-ideal effects such as capacitive feed-through and charge injection, which can all limit the performance of the system.

Figure 11:
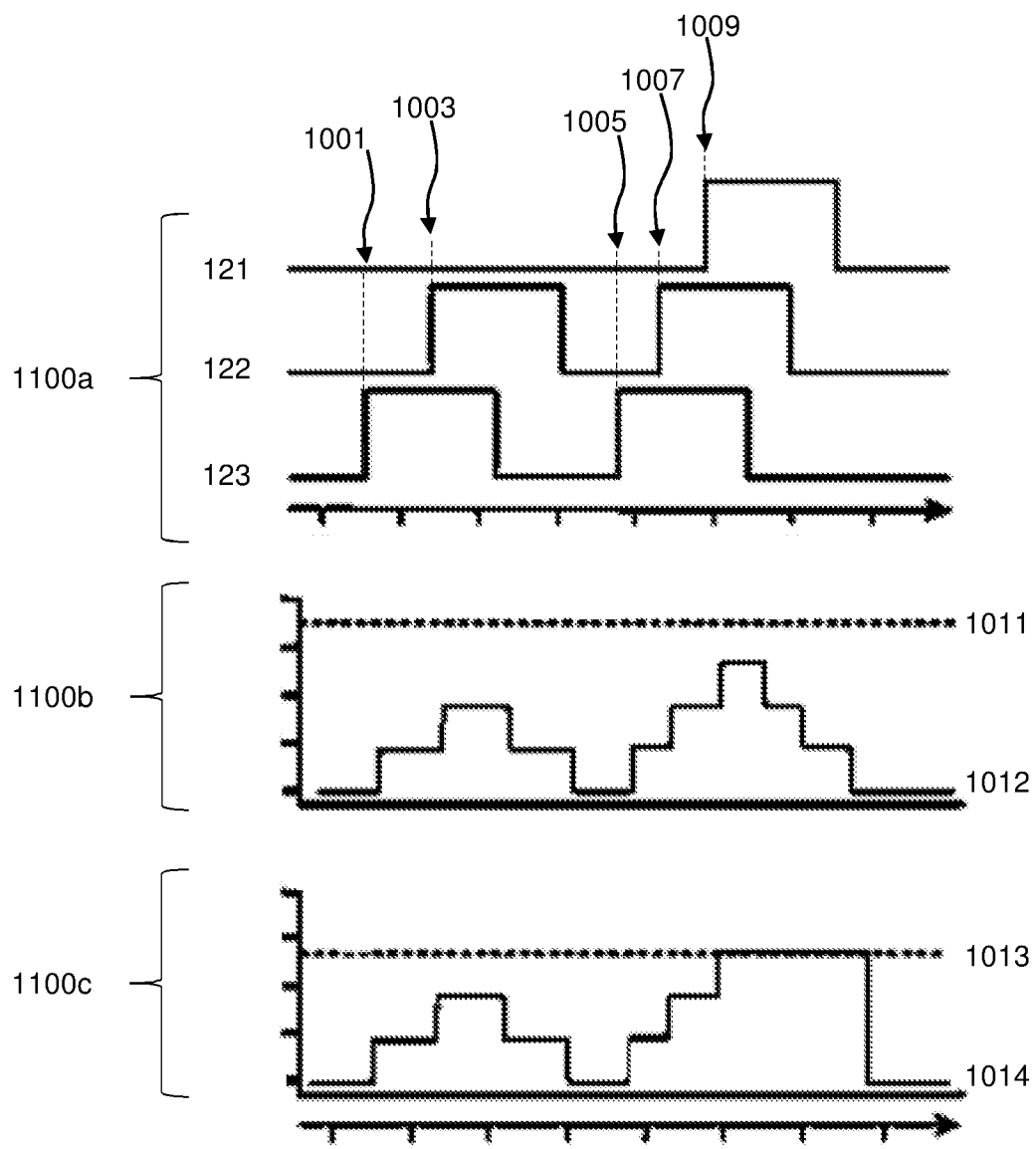
FIG. 11 is a timing diagram of the operation of a device according to an exemplary embodiment.

Exemplary embodiments of the present disclosure circumvent this issue by exploiting the digital nature of the raw input signals (i.e. the signals on lines 101, 103, 105, and 107). This done by performing a gating function in the digital regime (i.e. directly on the signal path of individual pixel elements) rather than on the discrete-valued analog signal 203 at node 205. This means that after a detection event has triggered the count extraction process, the falling edge of all count-contributing input pulses must be prevented from reaching their corresponding coupling port until the count extraction is complete. As such, this falling-edge blocking procedure is only initiated after a detection event, otherwise events that do not fall within the counting window (noise events) will be counted as well and no noise filtering is be possible. This procedure 1100 is shown in FIG. 11, and it is achieved using either one of the circuits (1200a, 1200b, and 1300) shown in FIGS. 12A, 12B, and 13, which are now described in detail below.

Figure 12A:
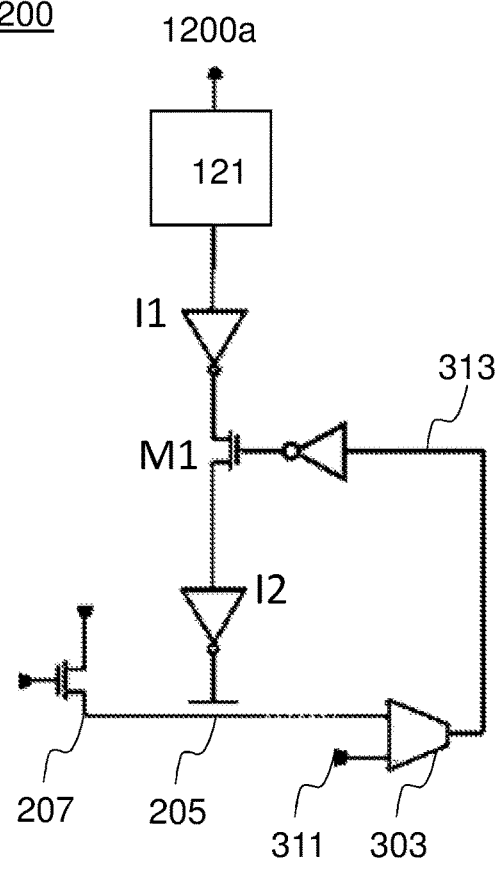
FIG. 12A and FIG. 12B are exemplary circuit architectures for operating a device in two distinct modes, according to an exemplary embodiment.

FIG. 12A shows an implementation for a single pixel (i.e. pixel 121). However, the same circuit can be used in the signal path of the other pixels. Transistor M1 acts as a switch driven by the control pulse (signal 313 in FIG. 1). Inverter 12 isolates the coupling node 205 from the switching action on the gate of M1. In a first operational mode, referred to herein as the "Hold and Count" mode, in addition to the falling edges of event pulses within the counting window, the output pulse from pixels triggered after the start of the count cycle are also blocked until the current counting cycle is complete. Therefore, in the Hold and Count mode, no activity is allowed at node 205 during the hold phase. Thus, referring to FIG. 4, instead of a signal like signal 401, signal 203 is present at node 5.

In the Hold and Count mode, the dead time following each detection event applies to all pixels in array 199. This configuration is sub-optimal for resolution of extended light pulses or continuous photon counting applications. Similar to the analog SiPM detectors, this implementation is best suited for photon number resolution tasks involving high intensity, short pulses of light.

Figure 12B:
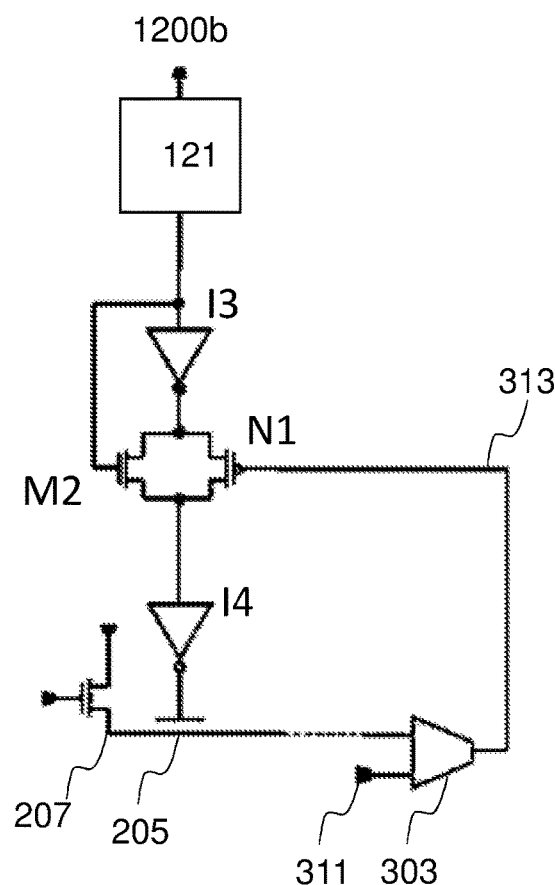

Circuit 1200*b* of FIG. 12B eliminates the dead time associated with the counting process. In this circuit transistor M2 automatically blocks the falling edge of a pixel pulse, while always allowing the rising edge to propagate down the signal path to the input coupling node. A secondary path through N1 remains open to the coupling port for both rising and falling pulse edge, before the count cycle is triggered and a count is initiated. The N1 path enables the falling edge associated with a SPAD output pulse, to extinguish signals that are below the triggering threshold (associated with non-detection events).

As such, the rising signal transitions from a SPAD element triggered during a counting cycle continue to pass through M2 and dynamically increment the interface signal 203 during the count extraction process. This second mode of operation is a "Free Running" mode of the digitization process. In this mode, circuit 201 continuously tracks the dynamically varying interface signal 203 in order to update the digital count 211 with any incoming events.

Figure 13:
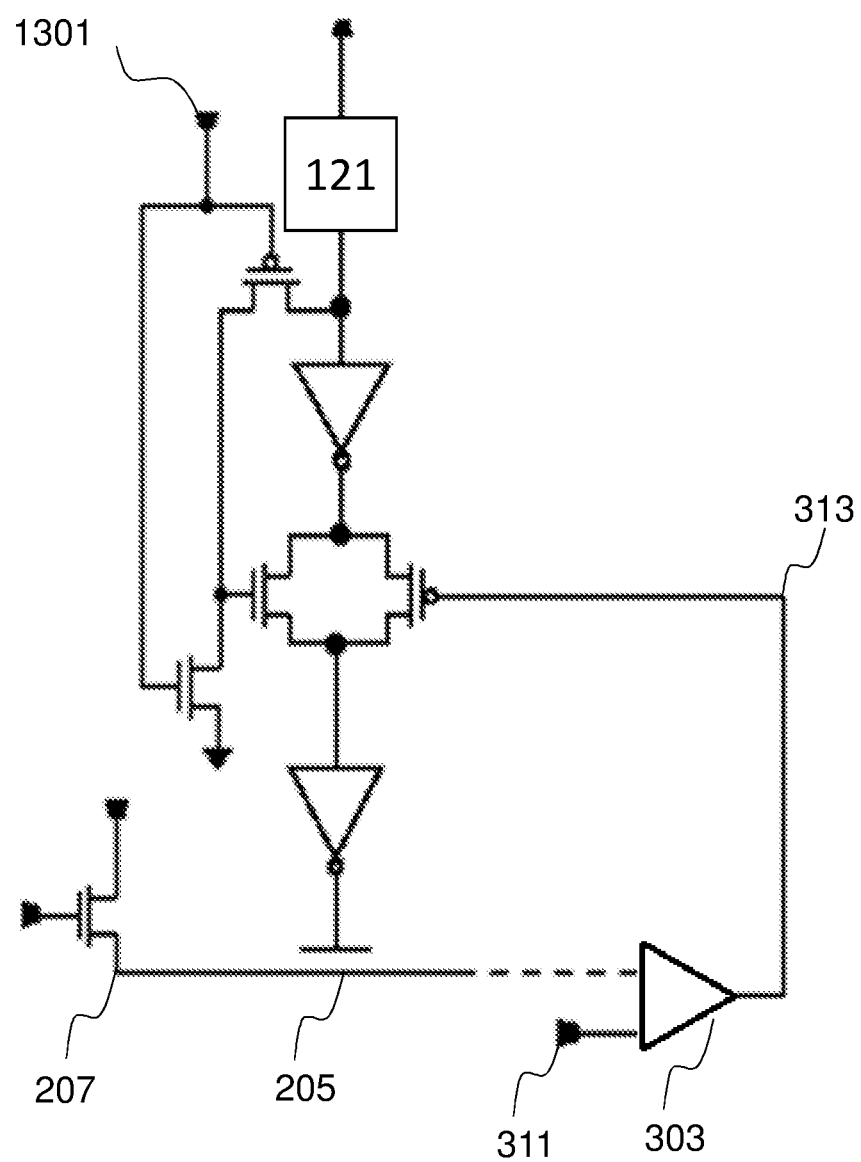
FIG. 13 is an illustration of an exemplary circuit architecture for alternating between the two distinct modes shown FIG. 12A and FIG. 12B.

The Free Running mode allows in a more accurate representation of the photon count data as it involves no counting dead time. In general this applies to detection scenarios where the signal of interest arrives as very short multi-photon pulses while any subsequent solitary events in between events can safely be regarded as noise or background signal. Measurement of photon number distribution for an atomic emission source and detection of scintillation photons are examples of applications that could better benefit from the Hold and Count mode, while for photon counting applications, the Free-Running mode is the most the optimal choice. In FIG. 13, the circuit 1300 is an exemplary implementation in which the Hold and Count mode and the Free Running mode can be toggled with a Boolean variable 1301.

FIG. 11 shows an exemplary operation of array 199 using the techniques and circuits described herein, particularly using the in-path gating signals obtained with one of FIG. 12A, FIG. 12B, and FIG. 13A). The operation for a five element SPAD cluster (like array 199 but with five pixels) is described below.

Traces 1100*a* represents the SPAD-generated digital activity profile at the input ports of the detector readout interface, in response to photon events 1001, 1003, 1005, 1007 and 1009. Traces 1100*b* illustrate the voltage response 1012 at the detector interface sense node 205 when photon detection threshold 1011 is set (at the drain of transistor 901) to correspond to a four event pile up. In this case, the detection threshold 1011 is not exceeded and in-path gating is not activated, therefore the voltage signal on the sense node is allowed to decay with the arrival of the falling edges associated with digital pulse activity at the input ports of the detector readout interface.

Traces 1100*c* illustrate the voltage response 1014 at the detector interface sense node 205 when photon detection threshold 1013 is set to correspond to a three event pile up. In this case detection threshold is exceeded for photon events 1005, 1007 and 1009, thus activating in-path gating, preventing propagation of the falling pulse edge to the input ports of the detector interface until count extraction is complete. As can be seen from FIG. 11, in-path gating of individual event pulses accomplishes the necessary sense node signal hold/freeze functionality without distorting the signal.

It should be noted that whether the in-path gating operation, triggered by a detection event, is applied only to SPADs contributing to the detection event or to all the elements of the SPAD cluster (array), during the count extraction process, depends upon the desired counting application, i.e. on which mode of operation (Hold and Count Configuration or Free Running) is being used.

Figure 16:
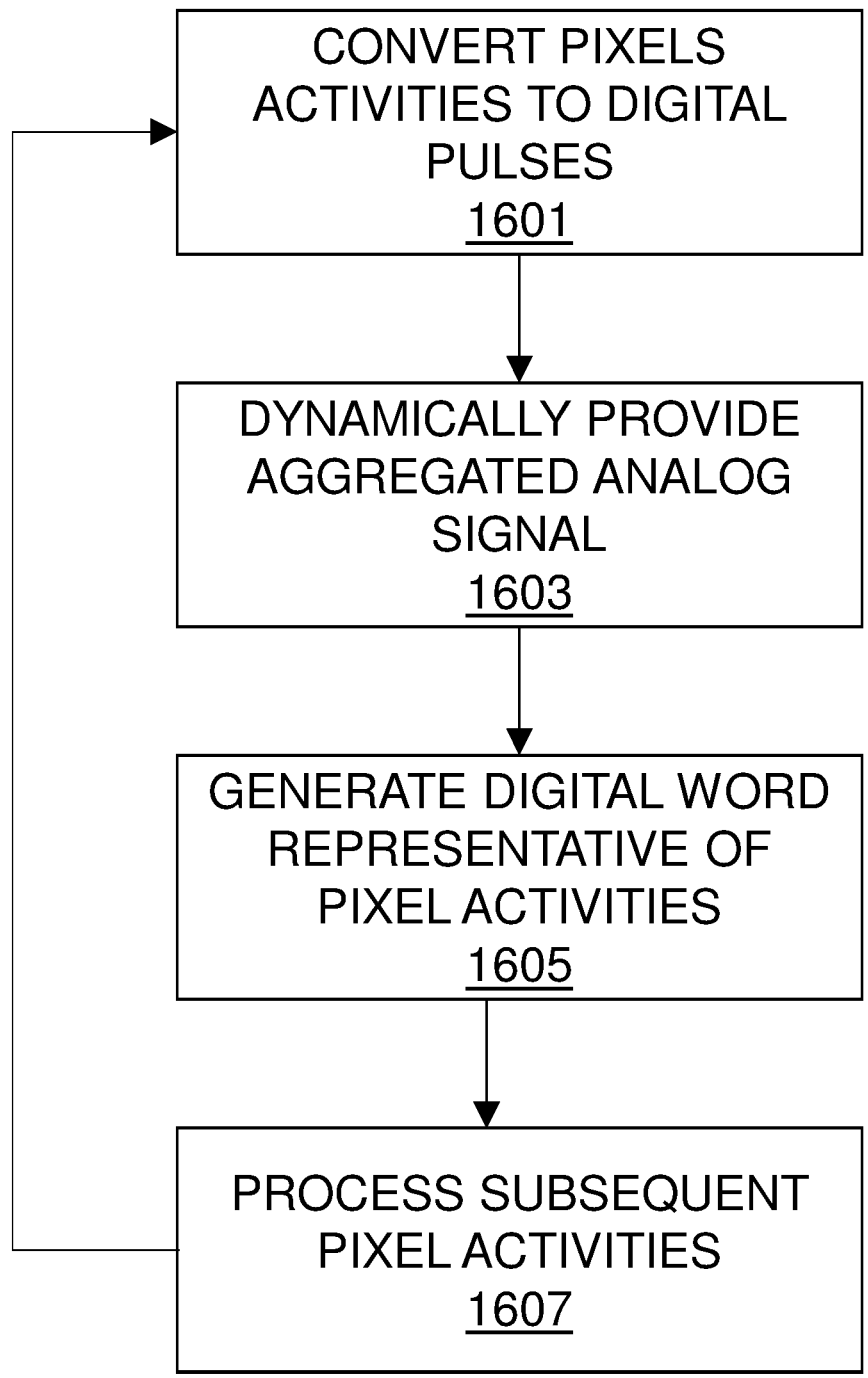
FIG. 16 is a flow chart illustrating a method according to an exemplary embodiment.

As configured, the various embodiments described in FIGS. 1-15 provide the many advantages described throughout the present disclosure. FIG. 16 illustrates an exemplary method 1600 of reading out pixel arrays based on the techniques described with respect to FIGS. 1-15. While only general steps are shown, one of skill in the art will readily appreciate that the all or part of the various techniques and procedures described above with respect to achieving the functions of the embodiments can be incorporated in a readout method or scheme.

Method 1600 includes converting the activity of at least two pixels into respective digital pulses (step 1601). Method 1600 further includes providing a dynamically aggregated analog signal as shown in FIGS. 1-3 (step 1603). Method 1600 may further include generating a digital word representative of the pixel activities based on the dynamically aggregated signal (step 1605). Method 1700 may also include processing subsequent pixel activities (step 1607) by returning to step 1601, following a reset, as discussed in with respect to circuit 201.

Digital SPAD array implementations suffer from architectural constraints that limit their throughput. Analog implementations benefit from the inherent asynchronous nature of analog signaling; however at the device level the analog output is highly prone to amplitude and timing variations. The extraction of relevant information from the analog detector response requires complex and power-intensive signal processing electronics. As such the utility of each approach has been limited to specific applications.

The present disclosure provides a novel paradigm for representation of SPAD-based array response whereby the robust nature of a digital single-photon SPAD output can be exploited in an array configuration capable of asynchronous, high throughput operation for parallel detection of multi-photon packets. The present teachings enable high photon-resolution capability in an array comprising digital SPADs coupled to a multi-input detector interface while using a single output port that includes a DC-biased floating node. The resulting platform enables accurately scaled dynamic summation of multiple digital pulses, with the sum signal being represented as an analog discrete-valued voltage waveform with clearly defined discrete amplitude levels.

Existing digitally implemented shared access architectures are based on first-in & take-all sharing schemes. The novel architecture featured herein offers a platform for multiple digitally interfaced SPADs to dynamically share a single processing resource, i.e. a digital counter, without data loss or delay. This novel hybrid architecture operates in both analog and digital domains to improve the performance of SPAD-based array detectors in both photon counting and photon number resolving modes of operation.

Those skilled in the relevant art(s) will appreciate that various adaptations and modifications of the embodiments described above can be configured without departing from the scope and spirit of the disclosure. Therefore, it is to be understood that, within the scope of the appended claims, the disclosure may be practiced other than as specifically described herein.

What is claimed is:

1. A device, comprising:
    a first circuit coupled to a first photodetector, the first circuit being configured to output a first digital pulse;
    a second circuit coupled to a second photodetector, the second circuit being configured to output a second digital pulse; and
    a readout circuit configured to process an analog signal representative of an activity of the first photodetector and the second photodetector within a coincidence threshold, the coincidence threshold being defined by a pulse width of one of the first digital pulse and the second digital pulse;
    wherein (i) the first circuit is configured to generate the first digital pulse in response to a rise in in current in the first photodetector, (ii) the second circuit is configured to generate the second digital pulse in response to a rise in current in the second photodetector, and (iii) the first circuit and the second circuit each includes a quenching circuit and a reset circuit.

2. The device according to claim 1, further comprising a first capacitor and a second capacitor each having a terminal connected to a terminal of a transistor at a sense node.

3. The device according to claim 2, wherein (i) the first circuit is configured to output the first digital to the first capacitor and (ii) the second circuit is configured to output the second digital pulse to the second capacitor.

4. The device according to claim 2, wherein a signal at the sense node is the analog signal.

5. The device according to claim 2, wherein the transistor is configured to provide a high impedance path from the sense node to another node held at a predetermined potential.

6. The device according to claim 2, wherein the predetermined potential is ground.

7. The device according to claim 1, wherein the readout circuit is configured to convert the analog signal into a digital signal representative of the activity of the first pixel and the two pixels within the coincidence threshold.

8. A device, comprising:
    a plurality of pixels, each including a digitizer circuit configured to output a digital whose rising edge corresponds to a rise in current in a photodetector; and
    a readout circuit configured to process an analog signal representative of an activity of the plurality of pixels during a predetermined time, the predetermined time being defined by a pulse width of the digital pulse;
    wherein the digitizer circuit includes a quenching circuit and a reset circuit configured to output the digital pulse.

9. The device according to claim 8, wherein the active and reset circuit further includes a toggle flip-flop configured to perform one of shrinking and expanding the pulse width of the digital pulse.

10. The device according to claim 8, further comprising a plurality of capacitors, each capacitor corresponding to a specified pixel of the plurality of pixels, and wherein each capacitor has a terminal connected to a terminal of a transistor at a sense node.

11. The device according to claim 10, wherein each of the digitizer circuit is configured to provide the digital pulse to the capacitor corresponding to the specified pixel.

12. The device according to claim 11, wherein a signal at the sense node is the analog signal.

13. The device according to claim 10, wherein the transistor is configured to provide a high impedance path from the sense node to another node held at a predetermined potential.

14. The device according to claim 8, wherein the readout circuit is configured to convert the analog signal into a digital signal representative of the activity of the first pixel and the two pixels during the predetermined time.

15. A method, for use with a device comprising a plurality of pixels, the method comprising:
    representing activity of least two pixels as at least two digital signals, each of the at least two digital signals being generated by a digitizer circuit including a quenching circuit and a reset circuit; and
    processing an analog signal corresponding to an activity of the at least two pixels during a predetermined time, the predetermined time being defined by a pulse width of one of the at least two digital signals.

16. The method according to claim 15, further comprising converting the analog signal into a representative digital word corresponding to the activity of the at least two pixels during the predetermined time.

17. The method of claim 15, wherein the at least two pixels include a single photon avalanche diode (SPAD).

* * * * *